(12) United States Patent
Scherer et al.

(10) Patent No.: US 6,613,241 B1
(45) Date of Patent: Sep. 2, 2003

(54) MEMS ELEMENTS WITH INTEGRATED POROUS MEMBRANES AND METHOD OF MAKING THE SAME

(75) Inventors: Axel Scherer, Laguna Beach, CA (US); Theodore Doll, Arnstadt (DE); Michael Hochberg, Pasadena, CA (US)

(73) Assignee: California Insitute of Technology, Pasadena, CA (US)

( * ) Notice: Subject to any disclaimer, the term of this patent is extended or adjusted under 35 U.S.C. 154(b) by 82 days.

(21) Appl. No.: 09/699,116

(22) Filed: Oct. 27, 2000

Related U.S. Application Data
(60) Provisional application No. 60/162,573, filed on Oct. 29, 1999.

(51) Int. Cl.⁷ ............................................... B44C 1/22
(52) U.S. Cl. ...................... 216/52; 216/17; 216/20; 216/56; 216/88; 428/138; 428/264; 428/45.1; 428/210; 428/321.84
(58) Field of Search ................ 216/2, 17, 20, 216/52, 56, 88; 428/138; 210/321.84; 264/45.1

(56) References Cited

U.S. PATENT DOCUMENTS

| | | | | |
|---|---|---|---|---|
| 3,797,202 A | * | 3/1974 | Neulander et al. ............... 96/5 |
| 4,840,819 A | * | 6/1989 | Williams et al. ............ 210/490 |
| 5,139,624 A | * | 8/1992 | Searson et al. ............. 205/656 |
| 5,198,112 A | * | 3/1993 | Martin et al. ............... 210/490 |
| 5,199,055 A | * | 3/1993 | Noguchi et al. ............ 378/210 |
| 5,585,011 A | * | 12/1996 | Saaski et al. ............... 210/490 |
| 5,830,261 A | * | 11/1998 | Hamasaki et al. ............. 95/46 |
| 5,919,364 A | * | 7/1999 | Lebouitz et al. ....... 210/321.84 |

* cited by examiner

Primary Examiner—Benjamin L. Utech
Assistant Examiner—Shamim Ahmed
(74) Attorney, Agent, or Firm—Daniel L. Dawes; Myers Dawes Andras & Sherman LLP

(57) ABSTRACT

The invention is a method of introducing porous membranes into MEMS elements by supporting the membranes by frames to form an heterostructure. This is achieved by attaching to a structured or porous substrate one or more monolithically fabricated frames and membranes. Having membranes disposed on frames enables them to be batch processed and facilitates separation, handling and mounting within MEMS or nanofluidic systems. Applications include, but are not limited to, filters for gases or liquids, electron transmissive windows and scanning electron microscopy (SEM) accessible arrays of nanotest tubes containing liquid phases and other sample states. The invention includes the apparatus made by the method.

22 Claims, 4 Drawing Sheets

MEMS ELEMENTS WITH INTEGRATED POROUS MEMBRANES AND METHOD OF MAKING THE SAME

RELATED APPLICATIONS

The present application is related to U.S. Provisional Patent Application Ser. No. 60/162,573 filed on Oct. 29, 1999.

BACKGROUND OF THE INVENTION

1. Field of the Invention

The invention relates to methods of introducing porous membranes into microelectromechanical (MEMS) elements by supporting the membranes by frames.

2. Description of the Prior Art

MEMS membranes have not yet been made by sintering granular matter, but by etching holes into a previously formed membrane, e.g. out of KOH-etching in silicon. Also polymer layers like PTFE containing pores have been incorporated into stacked systems. This, however requires hybrid mounting techniques.

Besides these techniques anodized alumina is available, since during electrochemical oxidation of an aluminum sheets vertical, parallel ordered pores of alumina with diameters in the range of 100 nm and a length of several tens of microns are formed. By dissolving the remaining aluminum and opening the pore bottoms, a highly porous membrane is formed. Single sheets of porous alumina have been already made available for filtering purposes and some attempts have been reported to use these porous layers as substrates for magnetic data storage or photonic crystals.

Some other materials have been reported as being fabricated in a porous form, e.g. silicon and indium phosphide, but no fabrication of membranes out of these materials has been reported.

Since alumina is a very hard and brittle material, membranes made of it could withstand high differential pressures, but they will break easily during handling. Ideas of making monolithically supported alumina membranes e.g. on silicon or Pyrex are hindered by the erosion of aluminum and porous alumina during substrate etches as well as, reversely, erosion of some substrates and resists during long anodizations in most of the acids. Additionally, quite thick aluminum layers (ranging from a few to tens of microns) are necessary to achieve a well-ordered porosity. This thickness cannot be achieved by typical vapor deposition methods of the metal. Thus, it is difficult to incorporate formation of porous alumina layers by processing alumina layers in a MEMS or CMOS process.

What is needed is some type of method to electrochemically make porous membranes which are mechanically stable in all processing, handling and mounting steps usually performed in the fabrication of microelectromechanical or microfluidic systems.

BRIEF SUMMARY OF THE INVENTION

The invention is a method of introducing porous membranes into MEMS elements by supporting the membranes by frames to form an heterostructure. This is achieved by attaching to a structured or porous substrate one or more monolithically fabricated frames and membranes. Having membranes disposed on frames enables them to be batch processed and facilitates separation, handling and mounting within MEMS or nanofluidic systems. Applications include, but are not limited to, filters for gases or liquids, electron transmissive windows and scanning electron microscopy (SEM) accessible arrays of nanotest tubes containing liquid phases and other sample states.

More specifically, the invention is defined as a method of fabricating a porous membrane comprising the steps of fabricating a porous membrane in a preporous first substrate in which the porous membrane has, an initial thickness which is greater than a predetermined final thickness. The porous membrane is then attached to a second substrate. The porous membrane is then thinned down to the thinner predetermined final thickness. The invention may also be practiced by omitting the thinning step.

The method further comprises selectively opening areas in the second substrate to define a frame to which the porous membrane is attached. The open areas in the second substrate are temporarily filled prior to thinning the porous membrane. In the illustrated embodiment, the step of thinning the porous membrane comprises grinding the porous membrane down to thinner predetermined final thickness.

Where the porous layer is composed of alumina, the step of attaching the porous membrane to a substrate comprises attaching the porous membrane to the second substrate by means of an adhesive layer or by means of annealing a aluminum layer disposed therebetween.

In another embodiment the method further comprises disposing a sacrificial layer between the porous membrane and the second substrate. The step of fabricating the porous membrane in the preporous first substrate comprises electroplating the first substrate onto the sacrificial layer and forming pores in the electroplated first substrate. In one version of this embodiment the step of disposing a sacrificial layer comprises disposing an organometallic or sputtered seed layer as the sacrificial layer. In the case where the second substrate is composed of silicon or Pyrex, the step of disposing the sacrificial layer on the second substrate comprises disposing a $Si_3N_4$, SiC, or PTFE/Teflon layer on the second substrate.

In still another embodiment the second substrate comprises an integral nonporous region of the first substrate and the step of attaching the porous membrane to the second substrate comprises fabricating the porous membrane in the first substrate outside of the integral nonporous region of the first substrate. The nonporous region of the first substrate is selectively structured to form a frame supporting the porous membrane.

Where the porous membrane is composed of alumina, the method further comprises chemomechanical polishing the porous membrane with sulfuric acid. Where the integral nonporous region of the first substrate is composed of aluminum, the method further comprises electrochemically etching a backside of the integral nonporous region with HCl acid.

The porous membrane is characterized by pores each having a pore bottom and the method further comprises thinning or opening the pore bottoms by ion beam etching. The opened porous membrane can be employed as a filter. In this case the method further comprises filling the pores with a filtering agent and employing the opened porous membrane as a mechanically stabilized filter. Alternatively the opened porous membrane can be employed as an array of electron transmissive windows. A charge applied to the opened porous membrane then allows the porous membrane to be employed as an electron collimator. The opened porous membrane can also be employed as an array of electron beam accessible nanotest tubes. The array of electron beam accessible array nanotest tubes can be used to separate a vacuum from a liquid phase. Still further the opened porous membrane can be employed as a microextractor. The invention is thus to be understood not only as defined as the described method, but also the apparatus made by the method. It must also be expressly understood that the described applications are but a small sample of the uses to which the method of the invention and the apparatus formed by the method can be employed.

While the method has been described for the sake of grammatical fluidity as steps, it is to be expressly understood that the claims are not to be construed as limited in any way by the construction of "means" or "steps" limitations under 35 USC 112, but to be accorded the full scope of the meaning and equivalents of the definition provided by the claims. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Using porous matter is mainly associated with its capability for filtering heterogeneous media, for instance for keeping particles from entering a water pipe. In very small regimes, such as in microfluidics, this becomes essential since pipe dimensions are usually in the range of microns, which is actually smaller than typical environmental suspended matter in water. Even when clean liquids or chemicals are used in microfluidics, some filter elements must be used. On the other hand those filters may play an active role as concentrators in these systems.

The fabrication of MEMS filter elements has to meet the specific technological requirements of the application to which it is applied. Micro- or nanofluidic systems are fabricated by stacking planar substrates containing membranes and through-holes, placing the planar elements on openings in a fluidic printed circuit board (PCB), or molding these elements in a polymer channel system. As such the filter elements must be capable of being handled and must withstand differential pressures which will be placed across them in the application to which they are applied.

Figure 1A:
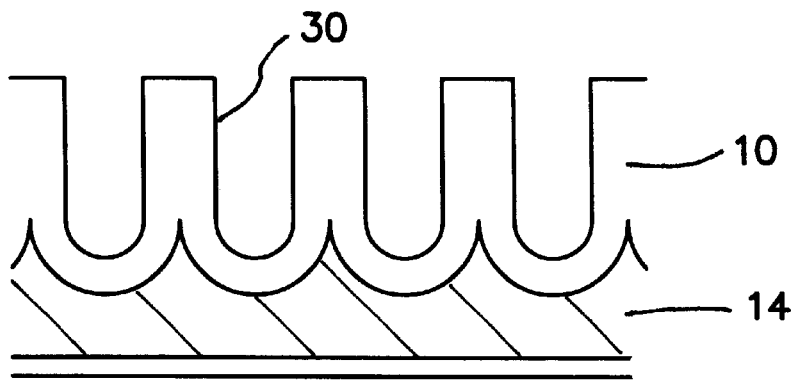
FIGS. 1a–d are diagrammatic cross-sectional side views of a first embodiment of the method of the invention.
Figure 1B:
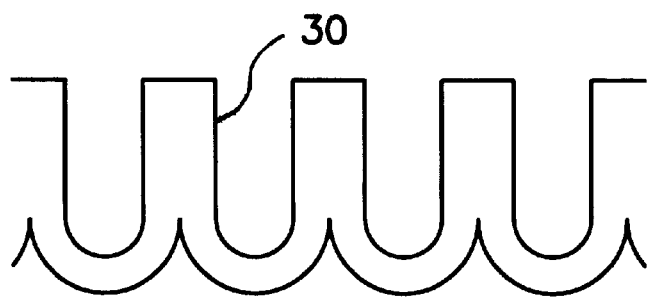
Figure 1C:
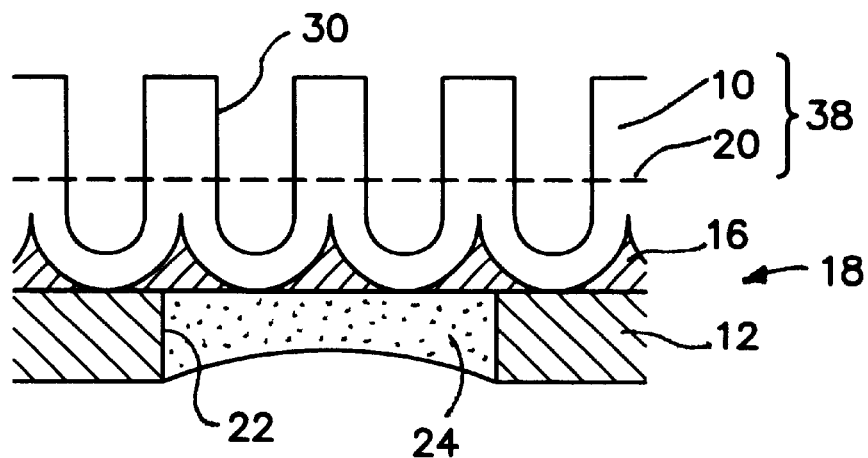

The solution presented here is based on the step of putting anodized porous membranes 10 on stabilizing frames or substrates 12 as shown in FIG. 1c in side cross-sectional view and a threefold way to achieve mechanically safe handling during all processing steps. Numerous new functional elements can be made using such membranes of which only a few are illustrated below.

In a first embodiment of the method of the invention as diagrammatically depicted in side cross-sectional view in FIGS. 1a–d, the method starts with forming porous membrane 10 from a preporous substrate 14 as shown in FIG. 1a in which porous membrane 10 is made thicker initially than its final desired membrane thickness. The thicker initial membrane 10, after dissolution from preporous material 12, may act as a substrate itself as depicted in FIGS. 1b and 3b and have a mechanical stability that enables further processing including the step of mounting the thick membrane onto a second substrate 12 as shown in FIG. 1c. The heterostructure of FIG. 1c, generally denoted by reference numeral 18, comprises a second substrate 12, an adhesive layer 16 disposed between porous membrane 10 and substrate 12. Heterostructure 18 is mechanically stable and porous membrane 10 can be ground down to its desired thickness shown by dotted line 20. In another embodiment adhesive layer 16 is an aluminum layer disposed between porous membrane 10 and substrate 12 and then annealed to bind membrane 10 and substrate 12 together.

Figure 1D:
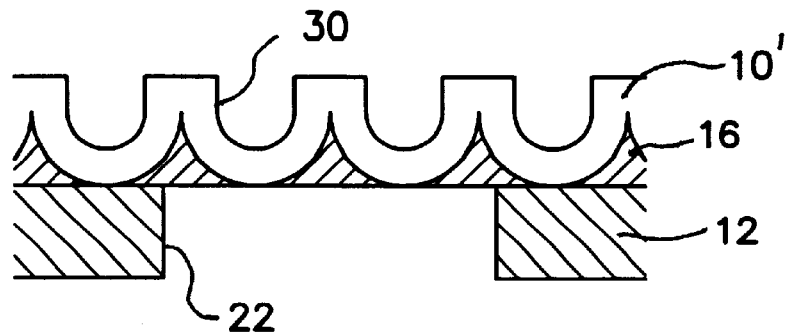

The second substrate 12 may be already structured and, for example, support frames underneath substrate 12. The unsupported membrane areas 22 within the heterostructure 18 can be furthermore stabilized for the grinding process by filling the open areas 22 from the backside, e.g. with a filling material or polymer 24. The filling material 24 can be removed as depicted in FIG. 1d after grinding to release thinned membrane or porous membrane 10' disposed across open areas 22. In the case of a porous alumina membrane 10 an initial thickness of 100 up to 200 microns can be realized which provides adequate handling stability for most MEMS and microfluidics processing when membrane 10 is dissolved from an aluminum substrate of 2 inches in diameter. Attachment to second substrate 12 can be achieved as shown in FIG. 1c using epoxy or a thin aluminum layer 16 on top of second substrate 12 that forms an uniform alumina layer 16 during any subsequent annealing steps.

Figure 2A:
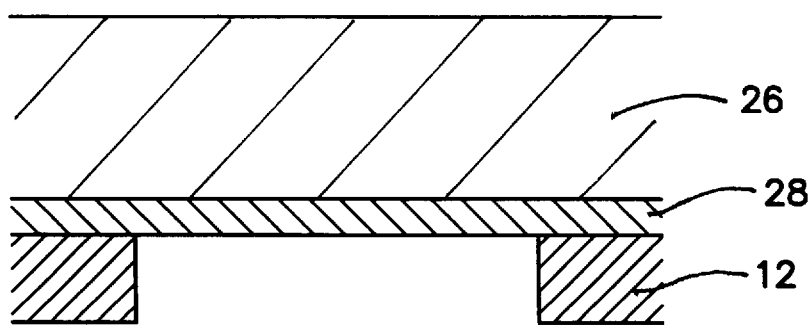
FIGS. 2a–c are diagrammatic cross-sectional side views of a second embodiment of the method of the invention.
Figure 2B:
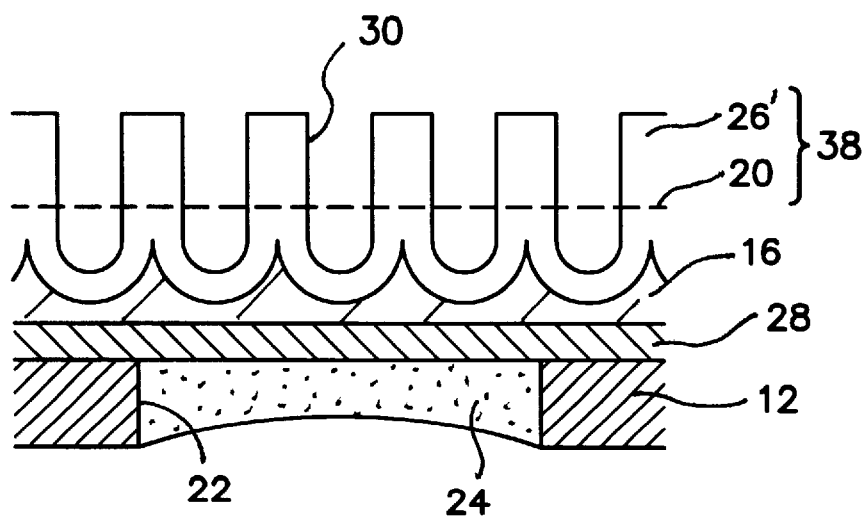
Figure 2C:
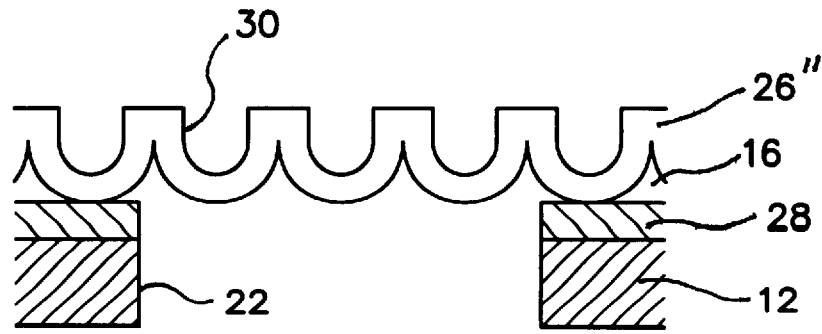
Figure 3A:
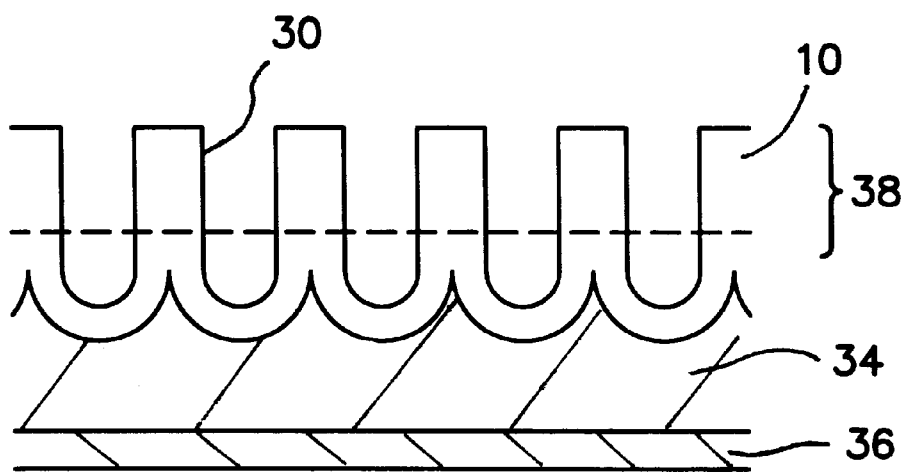
FIGS. 3a and b are diagrammatic cross-sectional side views of a third embodiment of the method of the invention.
Figure 3B:
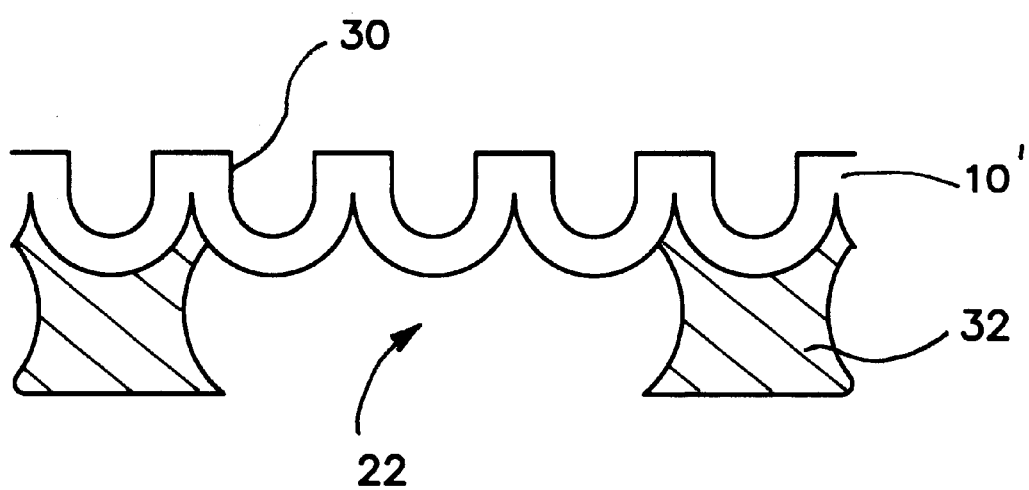

A second embodiment of the method as depicted in FIGS. 2a–c uses electroplating as shown in FIG. 3a to deposit a conductive thick preporous layer 26 on a sacrificial membrane 28 that is supported by second substrate 12 by means of adhesive layer 16. A filling material 24 may be disposed if desired for additional support in open areas 22 as in the case of the first embodiment above. After shielding of second substrate 12, if necessary, layer 26 is made porous by conventional means or by means described in copending application entitled, "A Method Of Forming Intermediate Structures In Porous Substrates In Which Electrical And Optical Microdevices Are Fabricated And Intermediate Structures Formed By The Same", Ser. No. 09/699,221 now U.S Pat. No. 6,350,623, entitled "A Method Of Forming Intermediate Structures In Porous Substrates In Which Electrical And Optical Microdevices Are Fabricated And Intermediate Structures Formed By The Same", filed Oct. 27, 2000, assigned to the same assignee of the present invention, which is incorporated herein by reference, as depicted in layer 26' in diagrammatic cross-sectional side view in FIG. 2b and then thinned to line 20 as depicted in layer 26" in diagrammatic cross-sectional side view in FIG. 2c. Sacrificial membrane 28 and any filler material 24 are then removed as depicted in diagrammatic cross-sectional side view in FIG. 2c.

Examples of materials for use in the second embodiment include silicon nitride or silicon carbide sacrificial layers 28 on silicon wafers 12 that form a membrane 26, 28 and/or serve as a shielding, a seed layer followed by subsequent aluminum deposition and anodization steps to form pores 30. The seed layer may be sputtered on or formed by an organometallic deposition.

Alternatively, starting with a Pyrex wafer 12, one can deposit PTFE/Teflon as sacrificial membrane 28, etch frames out of the Pyrex wafer 12 underneath sacrificial membrane 28 and sputter metal on top of membrane 28 to form layer 26, which will be followed by electroplating and/or directly anodizing of layer 26. Again sacrificial membrane 28 must be removed from underneath porous layer 26. The choice of materials for layer 26 and sacrificial membrane 28 may be interchanged.

If, in the second embodiment, the top of the porous layer 26' has to be removed, for instance because the pores 30 are less regularly formed during the beginning of the anodization process than later, the same filling of open areas 22 during a grinding step in FIG. 2b can be used as mentioned in the first method in FIG. 1c.

A third embodiment depicted in diagrammatic cross-sectional side views of a second embodiment of the method of the invention in FIGS. 3a and 3b describes a monolithic formation of a supporting frame 32 shown in FIG. 3b underneath porous membrane 10 using preporous substrate 34 shown in FIG. 3a. The process starts with anodization of preporous substrate 34, whose backside has been entirely covered with resist 36 to protect it from anodization. In the case of aluminum and using microelectronic photoresist as a protecting layer 36, oxalic acid will be a proper choice for anodization. This, however, makes grinding of the top alumina substrate 34 necessary done to dotted line 20, as pores 30 are less well ordered and defined in this upper region 38. In general, all grinding of porous alumina may be improved by using chemomechanical polishing, e.g. using up to 30% sulfuric acid, in order to avoid clogging of pores 30 by loose alumina particles.

After dissolution of the backside resist 36, supporting structures will be selectively lithographically covered on the backside of substrate 34. Portions of preporous substrate 34 remaining under the open areas 22 on the backside of substrate 34 are then etched away as shown in FIG. 3b yielding porous membrane 10' which is supported by structures or frame 32 made from its own preporous material 34. For aluminum, electrochemical etching of the backside of layer 34 in a 2.5% hydrochloric acid solution at a current of 1 A/cm$^2$ is recommended which removes 400 microns of Al within one hour. Supporting structures 32 may be designed as any kind of supporting frame (not shown) underneath membrane 10', which, if necessary, may be additionally mechanically connected to one or more frames 32 to maintain one stable substrate carrying several frames 32.

These mechanically supported membranes can be easily and safely separated from a supporting outer substrate frame and can be mounted as a functional element in a MEMS and/or nanofluidic system. An opening or thinning 40 of the pore bottoms can be realized by using an ion beam etch as depicted in FIG. 4 or, in the case of alumina, by hot phosphoric acid.

Figure 4:
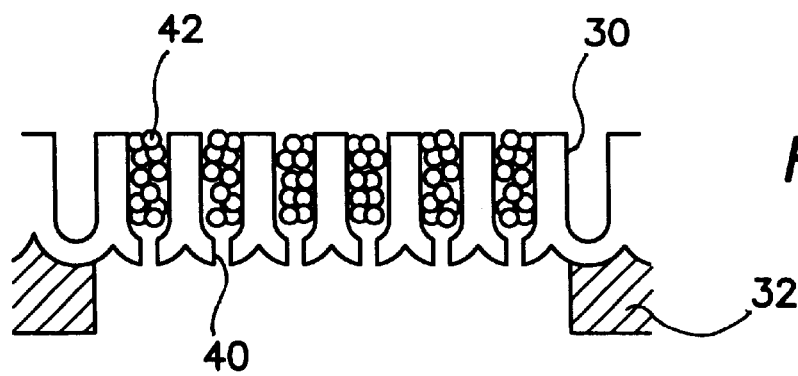
FIG. 4 is a diagrammatic cross-sectional side view of a further processing step of the embodiment of FIGS. 1d, 2c or 3b where the pore bottoms have been opened.

Applications of the structures discussed above range from filters for liquids or gases, which can be achieved by the opening of bottom pores as shown in FIG. 4 to filters for gases, which have closed bottom pores 30 for gases penetrating thin bottom walls. Open pores 30 which are filled with zeolithes, nanocrystals, selectively diffusible material or other active or passive filtering agent 42 as shown in FIG. 4 may serve as a mechanically stable matrix within frame 32 making the entire filter capable of withstanding high differential pressures.

Figure 5:
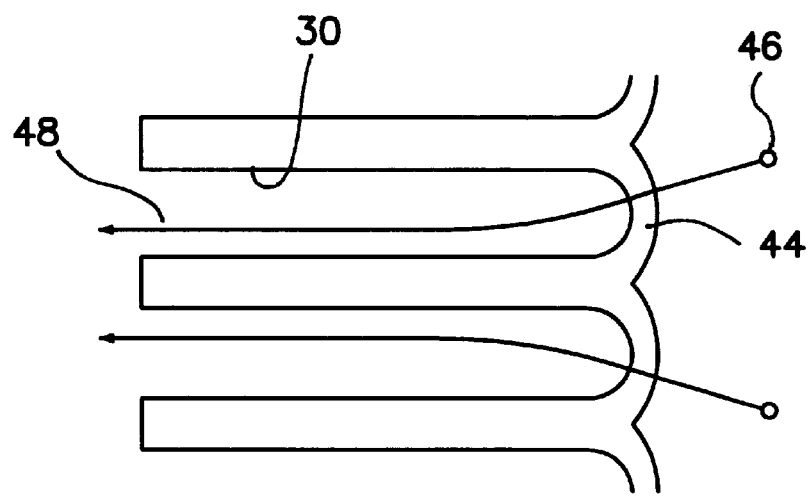
FIG. 5 is a diagrammatic cross-sectional side view of a further processing step of the embodiment of FIGS. 1d, 2c or 3b where the pore bottoms have been thinned and used as an electron transmissive window.

As the bottom domes 44 of pores 30 can be made very thin, e.g. by ion etch as depicted in FIG. 5 (ranging down to 10 nm for alumina), these regions will be transmissive to electrons, too. Thus electron transmissive vacuum windows can be made from porous MEMS membranes 10. In comparison to conventional planar membranes using $Si_3N_4$ or BN, their mechanical stability will be improved by the supporting porous structure of the invention. Electrons 46, once having entered a pore 30 through the bottom dome 44 will travel along the pore axis 48, inasmuch as charging pore 30 will have an effect like a Whenelt-cylinder. Thus, a highly parallel porous membrane window or dome 44 has a collimating effect on an electron beam.

Figure 6:
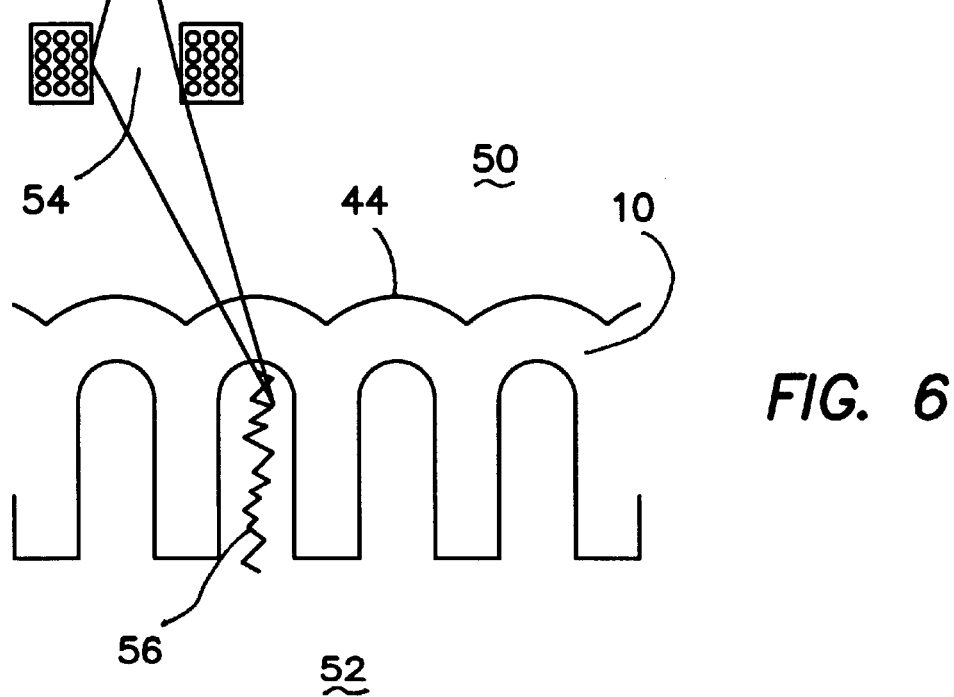
FIG. 6 is a diagrammatic cross-sectional side view of the embodiment of FIG. 5 where the structure is used for storing single molecules for optical, x-ray or electron beam interrogation.

These electron transmissive windows or domes 44 may even separate a vacuum 50 from a liquid phase 52 as depicted in FIG. 6. A porous membrane 10 with thin domes 44 may even serve as an array of vertical nano-test tubes that are accessed by e-beam or scanning electron microscope 54 for readout or modification of the tube contents 56.

Porous membranes 10 may also be used as thermally insulating elements as the total heat conductivity over pores 30 will be reduced in comparison to more compact material.

Finally, porous membranes 10 made of alumina may serve as filter elements within future micromachined extractors like coffee machines, as they can withstand a high water vapor pressure, have no influence on the beverage flavor and intrinsically satisfy food purity and sizing standards.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method of fabricating a porous membrane comprising:
   fabricating a porous membrane in a preporous first substrate, said porous membrane having an initial thickness which is greater than a predetermined final thickness;
   attaching said porous membrane having said initial thickness to a second substrate;
   thinning said porous membrane having said initial thickness down to said thinner predetermined final thickness;
   selectively opening areas in said second substrate to define a frame to which said porous membrane is attached; and
   temporarily filling said open areas in said second substrate prior to thinning said porous membrane.

2. The method of claim 1 where thinning said porous membrane comprises grinding said porous membrane down to thinner predetermined final thickness.

3. The method of claim 1, where said porous membrane is composed of alumina and where attaching said porous membrane to the second substrate comprises attaching said porous membrane to said second substrate by means of an adhesive layer disposed therebetween.

4. A method of fabricating a porous membrane comprising:
   fabricating a porous membrane in a preporous first substrate, said porous membrane having an initial thickness which is greater than a predetermined final thickness;
   attaching said porous membrane having said initial thickness to a second substrate; and
   thinning said porous membrane having said initial thickness down to said thinner predetermined final thickness; and
   wherein said porous layer is composed of alumina and where attaching said porous membrane to said second substrate comprises attaching said porous membrane to said second substrate by annealing an aluminum layer disposed therebetween.

5. The method of claim 1, further comprising disposing a sacrificial layer between said porous membrane and said second substrate.

6. A method of fabricating a porous membrane comprising:
   fabricating a porous membrane in a preporous first substrate, said porous membrane having an initial thickness which is greater than a predetermined final thickness;
   attaching said porous membrane having said initial thickness to a second substrate;
   thinning said porous membrane having said initial thickness down to said thinner predetermined final thickness;
   disposing a sacrificial layer between said porous membrane and said second substrate; and
   wherein fabricating said porous membrane in said preporous first substrate comprises electroplating said first substrate onto said sacrificial layer and forming pores in said electroplated first substrate.

7. The method of claim 6 where disposing a sacrificial layer comprises disposing a seed layer as said sacrificial layer.

8. The method of claim 7 where disposing a seed layer on said sacrificial layer comprising disposing an organometallic or sputtered seed layer.

9. The method of claim 5 where said second substrate is composed of silicon or Pyrex and where disposing said sacrificial layer on said second substrate comprises disposing a $Si_3N_4$, SiC, or PTFE/Teflon layer on said second substrate.

10. A method of fabricating a porous membrane comprising:
    fabricating a porous membrane in a preporous first substrate, said porous membrane having an initial thickness which is greater than a predetermined final thickness;
    attaching said porous membrane having said initial thickness to a second substrate;
    thinning said porous membrane having said initial thickness down to said thinner predetermined final thickness;
    disposing a sacrificial layer between said porous membrane and said second substrate;
    selectively opening areas in said second substrate to define a frame to which said porous membrane is attached; and
    temporarily filling said open areas in said second substrate prior to thinning said porous membrane.

11. A method of fabricating a porous membrane comprising:
    fabricating a porous membrane in a preporous first substrate, said porous membrane having an initial thickness which is greater than a predetermined final thickness;
    attaching said porous membrane having said initial thickness to a second substrate;
    thinning said porous membrane having said initial thickness down to said thinner predetermined final thickness; and
    wherein said second substrate comprises an integral nonporous region of said first substrate and where attaching said porous membrane to said second substrate comprises fabricating said porous membrane in said first substrate outside of said integral nonporous region of said first substrate, and selectively structuring said nonporous region of said first substrate to form a frame supporting said porous membrane.

12. The method of claim 11 where said porous membrane is composed of alumina and further comprising chemomechanical polishing said porous membrane with sulfuric acid.

13. The method of claim 11 where said integral nonporous region of said first substrate is composed of aluminum and further comprising electrochemically etching a backside of said integral nonporous region with HCl acid.

14. A method of fabricating a porous membrane comprising:
fabricating a porous membrane in a preporous first substrate, said porous membrane having an initial thickness which is greater than a predetermined final thickness;
attaching said porous membrane having said initial thickness to a second substrate;
thinning said porous membrane having said initial thickness down to said thinner predetermined final thickness; and
wherein said porous membrane is characterized by pores each having a pore bottom and further comprising thinning said pore bottoms by ion beam etching.

15. A method of fabricating a porous membrane comprising:
fabricating a porous membrane in a preporous first substrate, said porous membrane having an initial thickness which is greater than a predetermined final thickness;
attaching said porous membrane having said initial thickness to a second substrate;
thinning said porous membrane having said initial thickness down to said thinner predetermined final thickness; and
wherein said porous membrane is characterized by pores each having a pore bottom and further comprising opening said pore bottoms by ion beam etching.

16. The method of claim 15 further comprising employing said opened porous membrane as a filter.

17. The method of claim 16 further comprising filling said pores with a filtering agent and employing said opened porous membrane as a mechanically stabilized filter.

18. The method of claim 14 further comprising employing said thinned porous membrane as an array of electron transmissive windows.

19. The method of claim 18 further comprising applying a charge to said thinned porous membrane to employ said porous membrane as an electron collimator.

20. The method of claim 14 further comprising employing said thinned porous membrane as an array of electron beam accessible nanotest tubes.

21. The method of claim 20 further comprising employing said array of electron beam accessible array nanotest tubes to separate a vacuum from a liquid phase.

22. The method of claim 15 further comprising employing said opened porous membrane as a microextractor.

* * * * *